(12) United States Patent
Koyama et al.

(10) Patent No.: US 6,943,764 B1
(45) Date of Patent: Sep. 13, 2005

(54) DRIVER CIRCUIT FOR AN ACTIVE MATRIX DISPLAY DEVICE

(75) Inventors: Jun Koyama, Kanagawa (JP); Yuji Kawasaki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/448,756

(22) Filed: Nov. 24, 1999

Related U.S. Application Data

(60) Division of application No. 08/803,217, filed on Feb. 20, 1997, now abandoned, and a continuation of application No. 08/427,096, filed on Apr. 21, 1995, now abandoned.

(30) Foreign Application Priority Data

Apr. 22, 1994 (JP) .................................... 6-107574

(51) Int. Cl.[7] .............................................. G09G 3/36
(52) U.S. Cl. ............................. 345/92; 257/57; 257/59; 438/153
(58) Field of Search .............................. 257/52, 57, 59, 257/66, 67, 68, 69, 70, 71, 72, 347, 348, 257/349, 350, 44, 149; 438/151, 153, 154, 438/163, 166, 197, 199, 238, 239, 27, 28, 438/29, 30; 345/92, 93, 100, 204, 205, 206; 349/43; 377/74, 79; 315/169.3

(56) References Cited

U.S. PATENT DOCUMENTS

| | | | |
|---|---|---|---|
| 3,576,447 A | 4/1971 | McKenny | |
| 3,806,778 A | 4/1974 | Shimakura et al. | |
| 3,820,108 A | 6/1974 | Luce | |
| 3,885,196 A | 5/1975 | Fischer | |
| 3,935,083 A | 1/1976 | Tomozawa et al. | |
| 3,988,214 A | 10/1976 | Tsunemitsu | |
| 4,042,854 A | 8/1977 | Luo et al. | |
| 4,114,070 A * | 9/1978 | Asars | ....................... 315/169.3 |
| 4,232,327 A | 11/1980 | Hsu | |
| 4,357,179 A | 11/1982 | Adams et al. | |

(Continued)

FOREIGN PATENT DOCUMENTS

EP          0 553 775          8/1973

(Continued)

OTHER PUBLICATIONS

Inventors: Jun Koyama et al., Specification and Drawings for U.S. Appl. No. 09/448,463, filed Nov. 24, 1999, 41 pages, "Redundancy Shift Register Circuit for Driver in Active Matrix Type Liquid Crystal Disply Device".

(Continued)

Primary Examiner—Amr A. Awad
(74) Attorney, Agent, or Firm—Nixon Peabody LLP; Jeffrey L. Costellia

(57) ABSTRACT

In accordance with the present invention, an active matrix display device is presented. The display device comprises a substrate having an insulating surface, a plurality of pixel electrodes arranged in a matrix form over the substrate, and a plurality of switching elements operationally connected to the pixel electrodes. Each of the switching elements further comprise a thin film transistor. The display device further includes a display medium comprising an emissive material that is capable of electrically changing luminous strength disposed at each of the pixel electrodes, and a driver circuit that includes a plurality of thin film transistors for driving the plurality of switching elements. Each of the plurality of thin film transistors comprise a crystallized semiconductor layer, a gate insulating film adjacent to the crystallized semiconductor layer and a gate electrode adjacent to the gate insulating film.

36 Claims, 13 Drawing Sheets

U.S. PATENT DOCUMENTS

| | | |
|---|---|---|
| 4,368,523 A | 1/1983 | Kawate |
| 4,380,008 A | 4/1983 | Kawakami et al. |
| 4,409,724 A | 10/1983 | Tasch, Jr. et al. |
| 4,413,256 A | 11/1983 | Yasuda et al. |
| 4,429,305 A | 1/1984 | Hosokawa et al. |
| 4,468,855 A | 9/1984 | Sasaki |
| 4,470,060 A | 9/1984 | Yamazaki |
| 4,525,436 A | 6/1985 | Yamazaki |
| 4,557,036 A | 12/1985 | Kyuragi et al. |
| 4,597,160 A | 7/1986 | Ipri |
| 4,605,972 A | 8/1986 | Hatanaka |
| 4,641,156 A | 2/1987 | Ohta et al. |
| 4,646,426 A | 3/1987 | Sasaki |
| 4,693,770 A | 9/1987 | Hatada |
| 4,709,993 A | 12/1987 | Matsuyama et al. |
| 4,716,403 A | 12/1987 | Morozumi |
| 4,727,044 A | 2/1988 | Yamazaki |
| 4,728,617 A | 3/1988 | Woo et al. |
| 4,746,628 A | 5/1988 | Takafuji et al. |
| 4,757,028 A | 7/1988 | Kondoh et al. |
| 4,762,806 A | 8/1988 | Suzuki et al. |
| 4,762,807 A | 8/1988 | Yamazaki |
| 4,769,713 A | 9/1988 | Yasui |
| 4,772,927 A | 9/1988 | Saito et al. |
| 4,775,641 A | 10/1988 | Duffy et al. |
| 4,783,143 A | 11/1988 | Eicher et al. |
| 4,804,953 A | 2/1989 | Castleberry |
| 4,808,991 A | 2/1989 | Tachiuchi et al. |
| 4,816,893 A | 3/1989 | Mayer et al. |
| 4,818,077 A | 4/1989 | Ohwada et al. |
| 4,836,654 A | 6/1989 | Fujimura et al. |
| 4,838,654 A | 6/1989 | Hamaguchi et al. |
| 4,851,827 A | 7/1989 | Nicholas |
| 4,884,079 A | 11/1989 | Inoue et al. |
| 4,890,308 A | 12/1989 | Imai |
| 4,905,066 A | 2/1990 | Dohjo et al. |
| 4,916,090 A | 4/1990 | Motai et al. |
| 4,929,058 A | 5/1990 | Numao |
| 4,930,874 A | 6/1990 | Mitsumune et al. |
| 4,931,787 A | 6/1990 | Shannon |
| 4,938,565 A | 7/1990 | Ichikawa |
| 4,942,441 A | 7/1990 | Konishi et al. |
| 4,959,700 A | 9/1990 | Yamazaki |
| 4,960,719 A | 10/1990 | Tanaka et al. |
| 4,963,860 A * | 10/1990 | Stewart ............... 345/206 |
| 4,994,877 A | 2/1991 | Ino et al. |
| 5,038,368 A | 8/1991 | Lee |
| 5,053,354 A | 10/1991 | Tanaka et al. |
| 5,063,378 A | 11/1991 | Roach |
| 5,081,523 A | 1/1992 | Frazier |
| 5,097,311 A | 3/1992 | Iwase et al. |
| 5,100,810 A | 3/1992 | Yoshimi et al. |
| 5,111,060 A | 5/1992 | Asada |
| 5,111,261 A | 5/1992 | Tanaka et al. |
| 5,113,134 A | 5/1992 | Plus et al. |
| 5,117,298 A | 5/1992 | Hirai |
| 5,122,889 A | 6/1992 | Kaneko et al. |
| 5,132,677 A | 7/1992 | Nicholas |
| 5,151,689 A | 9/1992 | Kabuto et al. |
| 5,162,901 A | 11/1992 | Shimada et al. |
| 5,165,073 A | 11/1992 | Shaklee et al. |
| 5,165,075 A | 11/1992 | Hiroki et al. |
| 5,170,155 A | 12/1992 | Plus et al. |
| 5,170,244 A | 12/1992 | Dohjo et al. |
| 5,173,792 A | 12/1992 | Matsueda |
| 5,193,018 A | 3/1993 | Wu |
| 5,218,464 A | 6/1993 | Hiroki et al. |
| 5,222,082 A * | 6/1993 | Plus ............... 326/98 |
| 5,250,931 A * | 10/1993 | Misawa et al. ............ 345/206 |
| 5,260,818 A | 11/1993 | Wu |
| 5,261,156 A | 11/1993 | Mase et al. |
| 5,272,361 A | 12/1993 | Yamazaki |
| 5,274,279 A | 12/1993 | Misawa et al. |
| 5,275,872 A | 1/1994 | Chang |
| 5,280,280 A | 1/1994 | Hotto |
| 5,281,840 A | 1/1994 | Sarma |
| 5,287,095 A | 2/1994 | Kitazima et al. |
| 5,289,030 A | 2/1994 | Yamazaki et al. |
| 5,292,675 A | 3/1994 | Codama |
| 5,294,555 A | 3/1994 | Mano et al. |
| 5,294,811 A | 3/1994 | Aoyama et al. |
| 5,302,966 A | 4/1994 | Stewart |
| 5,308,998 A | 5/1994 | Yamazaki et al. |
| 5,323,042 A * | 6/1994 | Matsumoto ............... 257/350 |
| 5,348,903 A * | 9/1994 | Pfiester et al. ............ 438/152 |
| 5,349,226 A | 9/1994 | Kawaguchi et al. |
| 5,349,366 A | 9/1994 | Yamazaki et al. |
| 5,365,080 A | 11/1994 | Yamazaki et al. |
| 5,396,084 A | 3/1995 | Matsumoto |
| 5,399,231 A * | 3/1995 | McCarthy ............... 439/406 |
| 5,402,041 A | 3/1995 | Kishino et al. |
| 5,404,175 A | 4/1995 | Nagae et al. |
| 5,412,240 A | 5/1995 | Inoue et al. |
| 5,414,276 A * | 5/1995 | McCarthy ............... 257/57 |
| 5,414,442 A | 5/1995 | Yamazaki et al. |
| 5,416,043 A | 5/1995 | Burgener et al. |
| 5,418,636 A | 5/1995 | Kawasaki |
| 5,424,752 A | 6/1995 | Yamazaki et al. |
| 5,426,526 A | 6/1995 | Yamamoto et al. |
| 5,430,320 A | 7/1995 | Lee |
| 5,453,858 A | 9/1995 | Yamazaki |
| 5,459,090 A | 10/1995 | Yamazaki et al. |
| 5,465,053 A | 11/1995 | Edwards |
| 5,468,987 A | 11/1995 | Yamazaki et al. |
| 5,474,945 A | 12/1995 | Yamazaki et al. |
| 5,485,019 A | 1/1996 | Yamazaki et al. |
| 5,492,843 A | 2/1996 | Adachi et al. |
| 5,495,121 A | 2/1996 | Yamazaki et al. |
| 5,508,209 A | 4/1996 | Zhang et al. |
| 5,514,879 A | 5/1996 | Yamazaki |
| 5,517,543 A | 5/1996 | Schleupen et al. |
| 5,521,107 A | 5/1996 | Yamazaki et al. |
| 5,525,822 A | 6/1996 | Vinal |
| 5,530,266 A | 6/1996 | Yonehara et al. |
| 5,545,571 A | 8/1996 | Yamazaki et al. |
| 5,566,009 A | 10/1996 | Yamazaki et al. |
| 5,583,369 A | 12/1996 | Yamazaki et al. |
| 5,585,815 A | 12/1996 | Nakashima et al. |
| 5,592,008 A | 1/1997 | Yamazaki et al. |
| 5,595,923 A | 1/1997 | Zhang et al. |
| 5,631,664 A * | 5/1997 | Adachi et al. ............ 345/74.1 |
| 5,670,792 A | 9/1997 | Utsugi et al. |
| 5,701,166 A | 12/1997 | Fedorovish et al. |
| 5,701,167 A | 12/1997 | Yamazaki |
| 5,821,559 A | 10/1998 | Yamazaki et al. |
| 5,849,043 A | 12/1998 | Zhang et al. |
| 5,849,601 A | 12/1998 | Yamazaki |
| 5,854,494 A | 12/1998 | Yamazaki et al. |
| 5,889,291 A | 3/1999 | Koyama et al. |
| 5,938,839 A | 8/1999 | Zhang |
| 5,946,561 A | 8/1999 | Yamazaki et al. |
| 6,017,783 A | 1/2000 | Yamazaki et al. |
| 6,028,333 A | 2/2000 | Yamazaki et al. |
| 6,133,897 A | 10/2000 | Kouchi |
| 6,555,843 B1 | 4/2003 | Yamazaki et al. |

FOREIGN PATENT DOCUMENTS

| | | |
|---|---|---|
| EP | 0 554 063 | 8/1993 |
| EP | 0 650 197 A2 | 4/1995 |
| JP | 53-144297 | 12/1978 |
| JP | 54-70762 | 6/1979 |
| JP | 55-011329 | 1/1980 |
| JP | 56-59291 | 5/1981 |

| | | |
|---|---|---|
| JP | 57-99778 | 6/1982 |
| JP | 57-100467 | 6/1982 |
| JP | 5-823479 | 2/1983 |
| JP | 58-32466 | 2/1983 |
| JP | 58-81972 | 5/1983 |
| JP | 58-115864 | 7/1983 |
| JP | 58-118154 | 7/1983 |
| JP | 58-124273 | 7/1983 |
| JP | 58-158967 | 9/1983 |
| JP | 58-206121 | 12/1983 |
| JP | 58-206163 | 12/1983 |
| JP | 59-081621 | 5/1984 |
| JP | 59-159544 | 9/1984 |
| JP | 60-55665 | 3/1985 |
| JP | 60-98680 | 6/1985 |
| JP | 60-109282 | 6/1985 |
| JP | 60-113971 | 6/1985 |
| JP | 60-245172 | 12/1985 |
| JP | 61-004021 | 1/1986 |
| JP | 61-87371 | 5/1986 |
| JP | 61-187274 | 8/1986 |
| JP | 61-224360 | 10/1986 |
| JP | 61-263273 | 11/1986 |
| JP | 62-124769 | 6/1987 |
| JP | 62-269358 | 11/1987 |
| JP | 62-282464 | 12/1987 |
| JP | 63-096636 | 4/1988 |
| JP | 63-159826 | 7/1988 |
| JP | 63-178560 | 7/1988 |
| JP | 1-183853 | 7/1989 |
| JP | 01-194351 | 8/1989 |
| JP | 02-089030 | 3/1990 |
| JP | 2-103925 | 4/1990 |
| JP | 2-130912 | 5/1990 |
| JP | 2-207537 | 8/1990 |
| JP | 2-306664 | 12/1990 |
| JP | 2-307273 | 12/1990 |
| JP | 3-154383 | 7/1991 |
| JP | 03-179391 | 8/1991 |
| JP | 4-88642 | 3/1992 |
| JP | 4-220627 | 8/1992 |
| JP | 4-242724 | 8/1992 |
| JP | 4-242725 | 8/1992 |
| JP | 04-267563 | 9/1992 |
| JP | 4-360580 | 12/1992 |
| JP | 05-107558 | 4/1993 |
| JP | 5-114724 | 5/1993 |
| JP | 5-121440 | 5/1993 |
| JP | 5-166837 | 7/1993 |
| JP | 5-249495 | 9/1993 |
| JP | 5-275448 | 10/1993 |
| JP | 6-13397 | 1/1994 |
| JP | 6-82818 | 3/1994 |
| JP | 06-102531 | 4/1994 |
| JP | 6-250212 | 9/1994 |
| JP | 6-250214 | 9/1994 |
| KR | 92-704262 | 12/1992 |
| KR | 93-15063 | 7/1993 |
| KR | 94-3086 | 2/1994 |
| KR | 1995-0013793 | 11/1995 |
| KR | 1998-0010560 | 4/1998 |

OTHER PUBLICATIONS

Inventor: Shunpei Yamazaki, Specification and Drawings for U.S. Appl. No. 09/832,844, filed Apr. 12, 2001, 44 Pages, "Electro-Optical Device and Method for Manufacturing the Same".

Inventors: Jun Koyama et al., Specification and Drawings for U.S. Appl. No. 09/229,677, filed Jan. 13, 1999, 33 Pages, "Semiconductor Integrated Circuit".

"The IEEE Standard Dictionary of Electrical and Electronic Terms" Sixth Edition, (1996) p. 591.

* cited by examiner

REGISTER COLUMN OUTPUT SIGNAL

SAMPLE TIMING SIGNAL OUTPUT TERMINAL

| INPUT | | | | | | | OUTPUT | | |
|---|---|---|---|---|---|---|---|---|---|
| 2 | 3 | 4 | 5 | 6 | 7 | 8 | A | B | C |
| H | H | H | H | H | H | H | H | H | H |
| L | H | H | H | H | H | H | H | H | L |
| * | L | H | H | H | H | H | H | L | H |
| * | * | L | H | H | H | H | H | L | L |
| * | * | * | L | H | H | H | L | H | H |
| * | * | * | * | L | H | H | L | H | L |
| * | * | * | * | * | L | H | L | L | H |
| * | * | * | * | * | * | L | L | L | L |

*: don't care

SAMPLE TIMING SIGNAL
OUTPUT TERMINAL

DRIVER CIRCUIT FOR AN ACTIVE MATRIX DISPLAY DEVICE

This application is a Divisional of application Ser. No. 08/803,217 filed Feb. 20, 1997 now abandoned; which itself is a Continuation of application Ser. No. 08/427,096, filed Apr. 21, 1995, now abandoned.

BACKGROUND OF THE INVENTION

The present invention relates to a shift register circuit constructed by thin film transistor (TFTs), in particular, a redundancy shift register circuit.

A shift register circuit in which TFT's are used is utilized in a driver circuit of an image sensor or a liquid crystal display (LCD) device, in particular, recently, in a driver circuit of an active matrix type display device.

In an active matrix type display device, each pixel is arranged in a cross section portion of an active matrix circuit and connected with a switching element, and image information is controlled by on/off of the switching element. As a display media of such display device, a liquid crystal, plasma, an object (state) capable of electrically changing an optical characteristic (reflectance, refractive index, transmissivity, emission (luminous) strength) or the like are used. As a switching element, in particular, a three terminal element, that is, a field effect transistor having a gate, a source and a drain is used.

In a matrix circuit, a signal line (a gate line) which is arranged in parallel to a line is connected with gate electrodes of transistors with respect to the line, and a signal line (a source line) which is arranged in parallel to a column is connected with source (or drain) electrodes of the transistors with respect to the column. A circuit for driving the gate line is referred to as a gate driver circuit, and a circuit for driving the source line is referred to as a source driver circuit.

Since the gate driver circuit generates a vertical line scan timing signal with respect to an active matrix type display device, a shift register includes serial-connected registers (in a single line) corresponding to the number of gate lines with a vertical direction. As a result, switching of thin film transistors (TFTs) in an active matrix type display device is performed by the gate driver circuit.

Since the source driver circuit generates a horizontal line image signal of image data to be displayed on an active matrix type display device a shift register includes serial-connected registers (in a single line) corresponding to the number of source lines with a horizontal direction. Also, by a latch pulse synchronous with a horizontal scan signal, an analog switch is turned on or off. As a result a current is supplied from the source driver circuit to TFTs in an active matrix type display device, to control alignment of a liquid crystal cell.

Referring to FIG. 5, a common active matrix type display device will be described.

A horizontal line scan timing signal is generated by a shift register 51. Analog switches 53 and 54 are turned on and then a video signal is stored in analog memories 55 and 56 in response to the horizontal line scan timing signal. Image data corresponding to the video signal stored in the analog memories 55 and 56 is stored in analog memories 59 and 60 through analog switches 57 and 58 turned on by timing of a latch pulse. The image data is supplied from the analog buffers 59 and 60 to source lines of TFTs 63 and 64 through analog buffers 61 and 62 in an active matrix circuit 70 of an active matrix type liquid crystal display device in timing of the latch pulse.

On the other hand, a vertical line scan timing signal is generated by a shift register 52 and then supplied to gate lines of the TFTs 63 and 64 in the active matrix circuit 70 of the active matrix type liquid crystal display device. Therefore, the image data (voltage) supplied to the source lines is applied to liquid crystals 65 and 66, to determine alignment of the liquid crystals 65 and 66 connected with drain lines of the TFTs 63 and 64 the active matrix type liquid crystal display device is operated by the above operation.

Generally a shift register includes a circuit as shown in FIGS. 6A and 6B, in particular, a D-type flip-flop. FIG. 6A shows a D-type flip-flop constructed using analog switches, and FIG. 6B shows a D-type flip-flop constructed using clocked invertors. These operation will be described below.

In FIG. 6A, when an operation clock CK is a high level (H) and an input signal DATA is a high level (H), a complementary type transmission gate a-1 is turned on and then the input signal DATA is input to a complementary type invertor circuit a-2. Therefore, an output of the complementary type invertor circuit a-2 becomes a low level (L). In this state, complementary type transmission gates a-4 and a-5 are in a turn off state.

When the operation clock CK is changed to a low level (L) while the input signal DATA is a high level (H), the complementary transmission gate a-1 becomes a turn off state, the complementary type transmission gates a-4 and a-5 become a turn on state. Therefore, an output of the complementary invertor circuit a-2 is held to a low level (L).

Also, since the complementary type transmission gate a-5 becomes a turn on state, an output of an complementary type invertor circuit a-6 becomes a high level (H). In this state, a complementary type transmission gate a-8 becomes a turn off state.

When the operation clock CK is changed to a high level (H) again, the complementary transmission gate a-5 becomes a turn off state and the complementary type transmission gate a-8 becomes a turn on state, so that a previous signal level is held. Therefore, an output of the complementary type invertor circuit a-6 can be held to an input signal DATA having a high level (H) in synchronous with an operation clock CK.

As a result, a D-type flip-flop can be constructed using transmission gates. Also, when an input signal DATA is a low level (L), the above described operation is performed.

In FIG. 6B, when the operation clock CK is a high level (H) and the input signal DATA is a high level (H), an output of a complementary clocked invertor circuit b-1 becomes a low level (L) and then an output of the complementary invertor circuit b-2 becomes a high level (U). In this state, complementary clocked invertor circuits b-3 and b-4 are in a turn off state.

When the operation clock CK is changed to a low level (L) while the input signal DATA is a high level (H), the complementary clocked invertor circuits b-3 and b-4 are turned on, so that an output of the complementary type invertor circuit b-2 is held to a high level (H). An output of the complementary invertor circuit b-5 becomes a high level (H). In this state, the complementary clocked invertor circuit b-6 is a turn off state.

When the operation clock CK is changed to a high level again, the complementary type clocked invertor circuit becomes a turn off state, and the complementary type clocked invertor circuit becomes a turn on state. Therefore, an output of the complementary type invertor circuit can be held to an input signal DATA having a high level (H) in synchronous with an operation clock CK.

As a result, a D-type flip-flop is constructed by clocked invertors. Also, when an input signal DATA is a low level (L), the above described operation is performed.

In a shift register circuit used in gate and source driving circuits of a common active matrix type display device, as shown in FIGS. 2A and 2B, registers having the same number as the number of gate lines (or source lines) are connected in serial. In a gate driver circuit as shown in FIG. 2A, outputs of registers $SR_i$ (i=1 to n) in a shift register circuit 120 are connected to gate lines 123 and 124 through invertor type buffer circuits 121 and 122. In a source driver circuit as shown in FIG. 2B, outputs of registers $SR_i$ (i=1 to N) in a shift register circuit 125 are connected to control terminals of sampling transmission gates 128 and 129 through invertor type buffer circuits 126 and 127.

If at least one register has defect in the shift register circuit having serial-connected registers, image data and scan timing signals output from the defect register and later connected register are abnormal, an accuracy image cannot be obtained. This problem is due to a yield of a shift register.

SUMMARY OF THE INVENTION

The object of the present invention is to solve the above problems.

As shown in FIG. 1, a shift register circuit 104 includes at least one register group 103 and a register selecting switch 102. The register group includes register lines 101a, 101b, . . . , and 101n having a plurality of serial-connected registers SRAi, SRBi, . . . , and SRZi (i=1 to n), respectively. The register line selecting switch 102 selects one of the register lines.

In this structure, one register line is used as a main register line, and the other register lines are used as a subregister line. When a plurality of register groups are arranged in a shift register circuit, the register groups are connected with each other in serial, to use as a shift register constructing gate and source driver circuits. Defect detection terminals 105a, 105b, . . . , 105n are arranged with the register lines in the register group, respectively, so that whether or not each register line operates normally is detected. An output of a last register of each shift register line is connected with the register line selecting switch 103.

The register line selecting switch 103 has at least one bias circuit (as described later). A voltage is always applied to the bias circuit, switching operation by the bias circuit is performed by providing one bias.

When one of the register lines is selected by the register line selecting switch 103, register column selecting switches 106a, 106b, . . . , 106n selects registers included in the selected one of the register lines, respectively. The number of register column selecting switches coincides with the number of registers included in each register line. Each register column selecting switch selects one of a plurality of input signals as an output signal. A signal for selecting the output signal is generated by using an output signal of the bias circuit.

When defect is detected by examining a main register line using a defect detection terminal, one of subregister lines is examined by another defect detection terminal. When defect is not detected, the register line selecting switch 102 selects the one of the subregister lines. Simultaneously, the register column selecting switches select the registers of the selected subregister lines.

As a result, redundancy is performed for register lines in a register group, so that a yield for a whole shift register circuit can be improved.

DETAILED DESCRIPTION OF THE PREFERRED EMBODIMENTS

A thin film device (such as a complementary invertor circuit) used in the present invention will be described below.

A silicon oxide film having a thickness of 1000 to 3000 Å is formed as a base oxide film on a glass substrate (a low alkaline glass such as Corning 7059 or a quartz glass) by sputtering in an atmosphere containing oxygen. To improve productivity, A film to be deposited by decomposing a tetra-ethyl-ortho-silicate (TEOS) in plasma chemical vapor deposition (CVD) may be used.

An amorphous silicon film having a thickness of 300 to 5000 Å, preferably 500 to 1000 Å is deposited by plasma CVD and low pressure CVD (LPCVD) and then placed in a reducing atmosphere at 550 to 600° C. for 4 to 48 hours to crystallize it. After this process, crystallinity may be increased (improved) by laser irradiation. The crystallized silicon film is patterned to form island regions 1 and 2. Further, a silicon oxide film 3 having a thickness of 700 to 1500 Å is formed on the island regions 1 and 2 by sputtering.

Figure 10A:
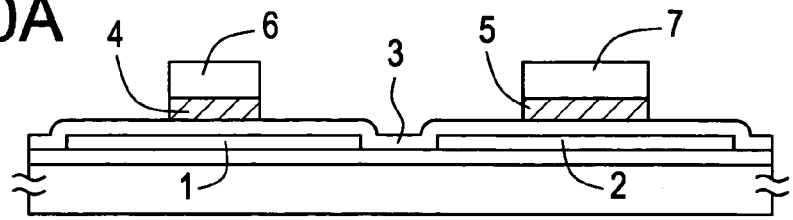
FIGS. 10A to 10F show a method for forming complementary invertor circuit.

An aluminum (containing Si of 1 weight % or Sc (scandium) of 0.1 to 0.3 weight %) film having a thickness of 1000 Å to 3 μm is formed by electron beam evaporation or sputtering. A photoresist (for example, a product of Tokyo Ohka Co. Ltd. OFPR800/30 cp) is formed by spin coating. When an aluminum oxide film having-a thickness of 100 to 1000 Å is formed on a surface thereof by anodization after formation of the photoresist, adhesion to the photoresist is high. Also, by suppressing a leak current from a photoresist, it is effective on formation of a porous anodic oxide in only side surface in a later anodization process. The photoresist and the aluminum film are patterned and etched to form gate electrodes 4 and 5 and mask films 6 and 7. (FIG. 10A).

Figure 10B:
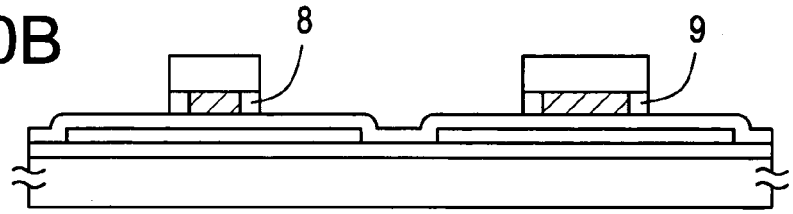

The formed substrate is anodized by supplying a current in an electrolytic solution, to form an anodic oxide having a thickness of 3000 to 6000 Å, for example, 5000 Å. The anodization is performed using an acid solution containing citric acid, nitric acid, phosphoric acid, chromic acid, sulfuric acid, oxalic acid or the like of 3 to 20% by applying a voltage of 10 to 30 V to a gate electrode at a constant current. In the embodiment, the anodization is performed in an oxalic acid solution (30° C.) at 10 V for 20 to 40 minutes. A thickness of an anodic oxide is adjusted by an anodization time. (FIG. 10B).

After that, the mask films are removed, and then a current is supplied to the gate electrodes in an electrolytic solution (ethylene glycol solution containing tartaric acid, boric acid, nitric acid of 3 to 10%) again. In order to obtain a superior oxide film, it is preferred that a temperature of the solution is about 10° C. and lower than a room temperature. As a result, barrier type anodic oxides 10 and 11 are formed in upper and side surfaces of the gate electrodes. Thicknesses of the anodic oxides 10 and 11 are proportional to an applied voltage. For example, when an applied voltage is 150 V, an anodic oxide having a thickness of 2000 Å is formed. Thicknesses of the anodic oxides 10 and 11 are determined by a necessary offset size. Although an anodic oxide having a thickness of 3000 Å or more is formed by applying 250 V or higher, since this influences TFT characteristics, it is desired that an anodic oxide having a thickness of 3000 Å or less is formed. In the embodiment, a voltage is increased until 60 to 150 V and selected by necessary thicknesses of the anodic oxides 10 and 11.

In this state, although a barrier type anodic oxide is formed by a later process, the barrier type anodic oxides 10 and 11 are formed between the porous anodic oxides 8 and 9 and the gate electrodes 4 and 5 without forming barrier type anodic oxides outside porous anodic oxides.

Figure 10C:

An insulating film 3 is etched by dry etching or wet etching. A depth of etching is arbitrary. Etching may be performed until an active layer formed under the insulating film 3 is exposed. Etching may be stopped on halfway. However, it is desired to etch the insulating film 3 until an active layer is exposed, in mass productivity, yield and uniformity. In this state, insulating films 12 and 13 covered with the anodic oxides 8 and 9 and the gate electrodes 4 and 5 remain as a gate insulating film. (FIG. 10C).

After that, the anodic oxides 8 and 9 are removed. it is preferred that a solution containing phosphoric acid, for example, a mixture acid containing phosphoric acid, acetic acid and nitric acid is used as an etchant. In using an etchant containing phosphoric acid, an etching rate of a porous anodic oxide is ten times or more as large as that of a barrier type anodic oxide. Therefore, since barrier type anodic oxides 10 and 11 are not etched substantially by the etchant containing phosphoric acid, the gate electrodes can be protected from etching.

Figure 10D:
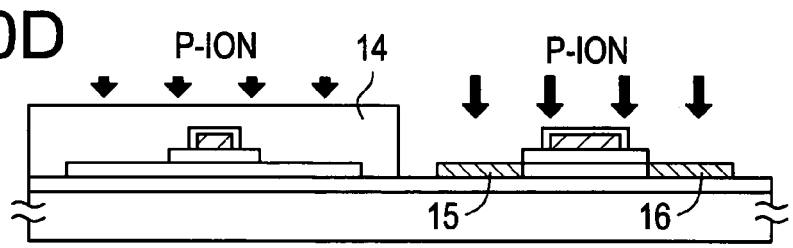

In such structure, a source and a drain are formed by implanting N-type or P-type impurity ion into an active layer. In a state wherein a left TFT region is covered with a mask 14, a phosphorus ion is irradiated (introduced) by ion doping at a relatively low speed (an accelerating voltage of 5 to 30 kV, 20 kV in the embodiment). A doping gas is phosphine ($PH_3$). A dose is $5 \times 10^{14}$ to $5 \times 10^{15}$ cm$^{-2}$. In this process, since a phosphorus ion cannot be transmitted through the insulating film 13, it is implanted into only region in which a surface is exposed, so that a drain 15 and a source 16 of an N-channel type TFT are formed. (FIG. 10D).

Figure 10E:
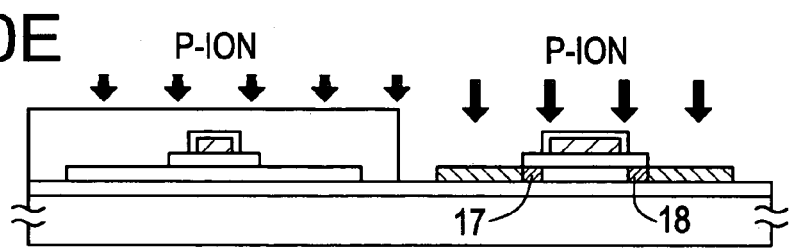

Also, a phosphorus ion is irradiated by ion doping at a relatively high speed (an accelerating voltage of 60 to 120 kV, 90 kV in the embodiment). A dose is $1 \times 10^{13}$ to $5 \times 10^{14}$ cm$^{-2}$. In this process, a phosphorus ion is transmitted through the insulating film 13 and reaches a region formed under the film 13. However, since a dose is small, N-type regions 17 and 18 each having a low concentration are formed. (FIG. 10E).

After phosphorus doping, the mask is removed. Then, using the N-channel type TFT as a mask, as described above, a source 19, a drain 20 and a P-type regions 21 and 22 each having a low concentration in a P-channel type TFT. A KrF excimer laser (wavelength of 248 nm and pulse width of 20 ns) is irradiated to activate an impurity ion introduced into an active layer.

A silicon oxide film having a thickness of 3000 to 6000 Å is formed as an interlayer insulator 23 on a whole surface by CVD. Also, contact holes are formed in a source and a drain of a TFT and then aluminum wiring-electrodes 24 to 26 are formed.

Figure 10F:
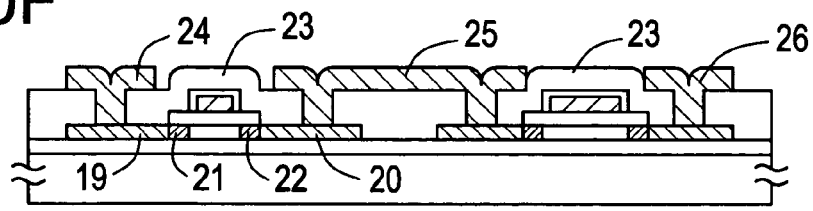

Further, hydrogen annealing is performed at 200 to 400° C. As a result, a complementary invertor circuit using TFTs is completed. (FIG. 10F).

A shift register in the embodiment is formed in a basis of the above complementary invertor circuit. A shift register used in a driver circuit of an active matrix type display device and an active matrix circuit having pixel TFTs are formed on the same substrate.

Referring with FIG. 3, an embodiment of the present invention will be described.

In the embodiment, one main register line and one sub-register line are used in each register group, and three registers are included in each register line. Also, the number of register groups is a positive integer and a multiple of three, for example.

Figure 3:
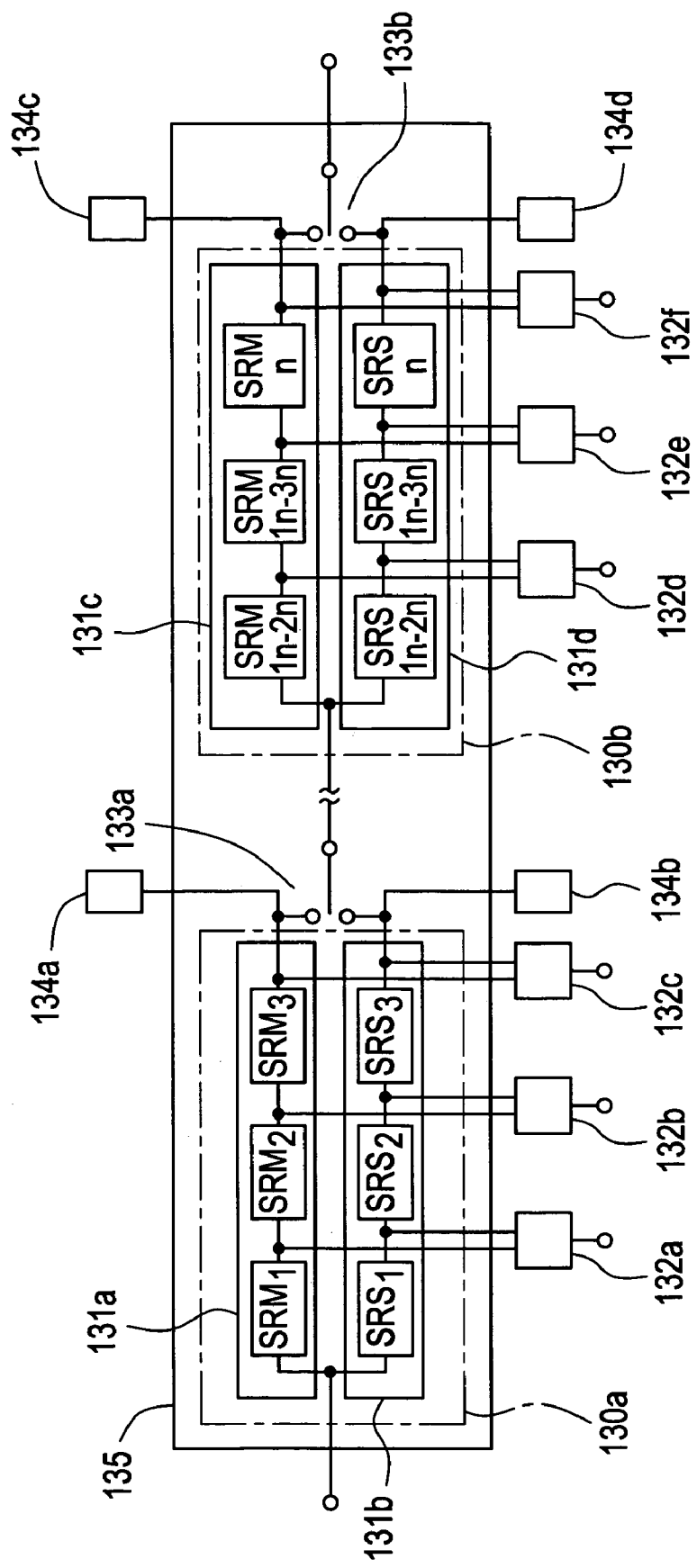
FIG. 3 shows a shift register circuit of an embodiment.

As shown in FIG. 3, a shift register circuit 135 includes register groups 130a, ..., 130b. The register group 130a includes a main register line 131a having registers $SRM_1$, $SRM_2$ and $SRM_3$ and a subregister line 131b having registers $SRS_1$, $SRS_2$ and $SRS_3$. The register group 130b includes a main register line 131c having registers $SRM_{N-2}$, $SRM_{N-1}$ and $SRM_N$ and a subregister line 131d having registers $SRS_{N-2}$, $SRS_{N-1}$ and $SRS_N$.

Register line selecting switches 133a and 133b are arranged to select the register lines in each register group. Defect detection terminals 134a and 134b are arranged to detect outputs of last registers of the register lines, so that whether or not each register line includes defect is detected.

Register column selecting switches 132a to 132f are arranged to select registers included in the selected register lines in each register group.

First, the main register line is examined by using the defect detection terminal in each register group. If the line is normal, the register line selecting switch is connected with the main register line. On the other hand, if the main register line has defect, the register line selecting switch is connected with the subregister line.

A conventional shift register circuit is compared with a shift register circuit according to the present invention.

Figure 1:
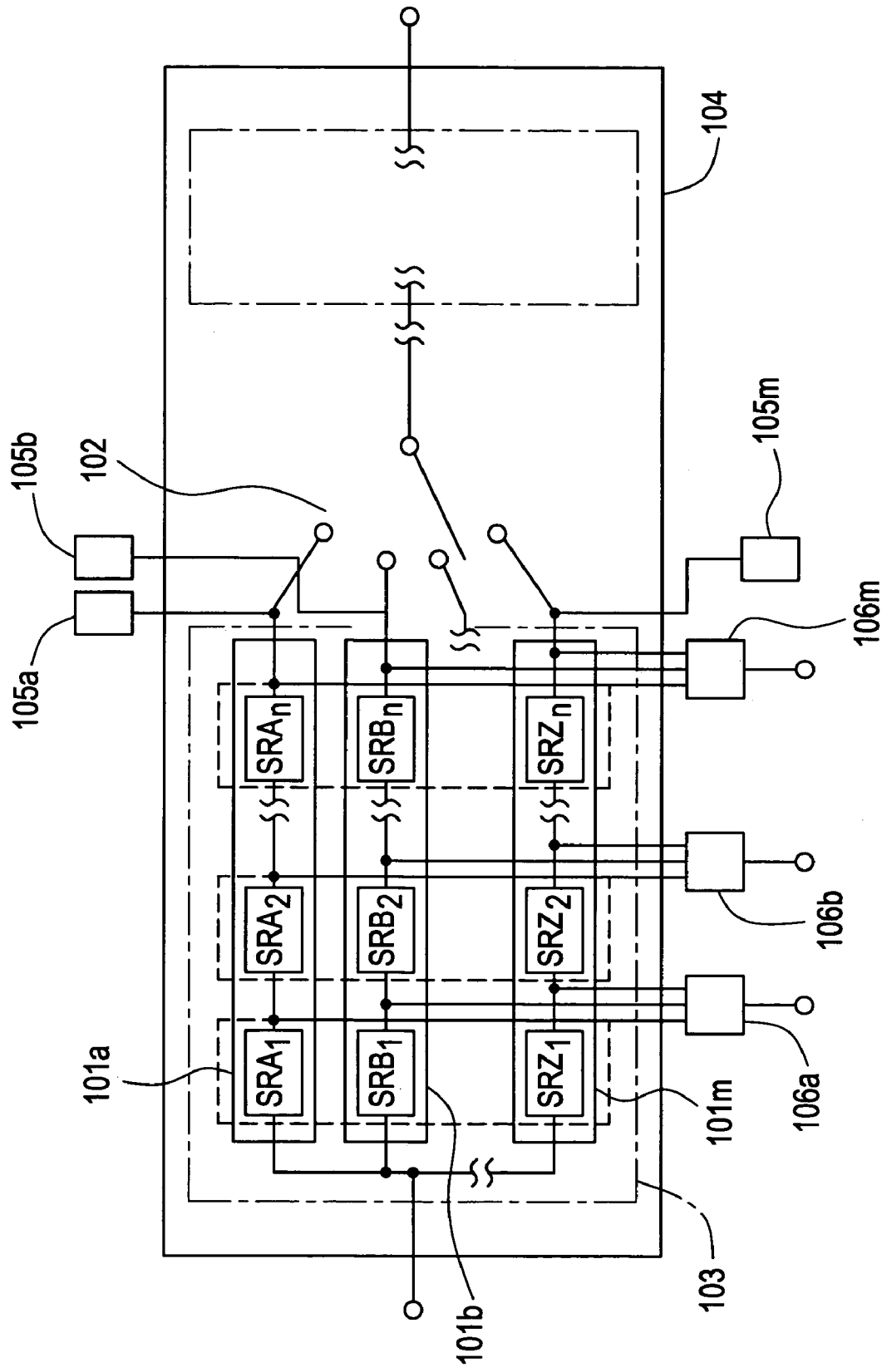
FIG. 1 shows a redundancy shift register circuit in a driving circuit of an active matrix type display device according to an embodiment of the present invention.
Figure 2A:
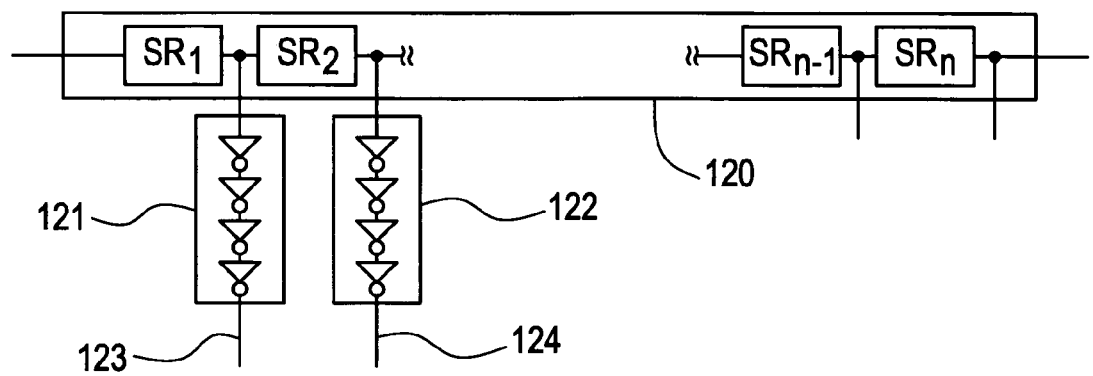
FIGS. 2A and 2B show a shift register circuit in a driving circuit of a common active matrix type display device, respectively.
Figure 2B:
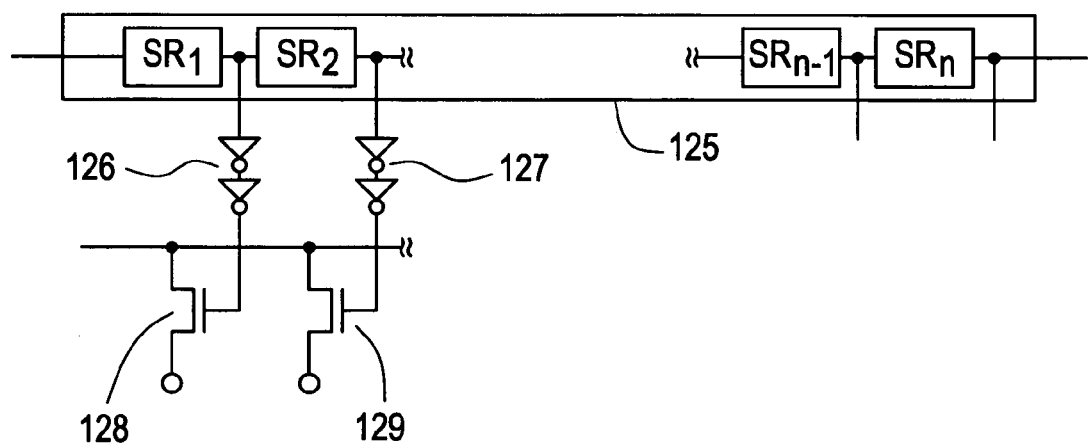

In a conventional shift register circuit as shown in FIG. 2, when a defective rate per register is $f_n (0 < f_n < 1)$ and the number of registers to be serial-connected is N (a positive integer and a multiple of three), a probability An which a conventional shift register circuit as shown in FIG. 2 is operated normally is obtained by the following equation, $$An = (1 - f_n)^N.$$

In a shift register circuit of the present invention, the same defective rate per register $f_n (0 < f_n < 1)$ is used. Also, the number of registers when all registers of each register group in one line are connected in serial is used as N (a positive integer and a multiple of three). Further, each register line includes three registers.

In this state, a probability Bn which one register group is not operated normally is obtained by the following equation, $$Bn=\{1-(1-f_n)^3\}^2.$$

Therefore, since the number of register groups is N/3, a probability Cn which a whole shift register circuit is operated normally is obtained by the following equation, $$Cn=[1-\{1-(1-f_n)^3\}^2]^{N/3}=[1-\{1-2(1-f_n)^3+(1-f_n)^6\}]^{N/3}=[(1-f_n)3\{2-(1-f_n)3\}]^{N/3}$$

If $F_n=1-f_n$ and r=N/3 (r is a positive integer),
$An=F_n^{3r}$, and
$Cn=F_n^{3r}(2-F_n^3)^r$.
In this state, from $0<f_n<1$,
$0<(1-f_n)=F_n<1$, and
$0<F_n^3<1$.
Therefore,
$1<(2-F_n^3)<2$, and
$1<(2-F_n^3)^r<2^r$.
From the above relationship,
$Cn-An=F_n^{3r}\{(2-F_n^3)^r-1\}>0$.
As a result, An<Cn.

When the number of registers included in a source driver circuit is 480 and a defective rate of register is 0.001, a probability An' which a conventional source driver circuit is operated normally is $$An'=(1-0.001)^{480}=0.619.$$

On the other hand, a probability Cn' which a redundancy source driver circuit according to the present invention is operated normally is $$Cn'=[1-\{1-(1-0.001)^3\}^2]^{480/3}=0.999$$

Therefore, it is confirmed that An'<Cn'.

As described above, redundancy of a register line increases a probability which a shift register is operated normally. If a defective rate per register is the same, this relationship is always obtained without depending on the number of registers included in one register line, the number of register lines and the number of register groups.

Structures of a register line selecting switch will be described below using FIGS. 11A and 11B.

The register line selecting switch includes bias circuit 90a to 90g, a priority encoder circuit 81 and a multiplexer circuit 82.

Output terminals of register lines 80a to 80h are connected with input terminals (X) of the multiplexer 82. The bias circuits are arranged in correspondent to register lines each having an output terminal, and the output terminals are connected with input terminals (X) of the priority encoder circuit 81.

When outputs of the bias circuits are held, the priority encoder circuit 81 converts a bit position of L of bit string to be input into binary data and then outputs the binary data (bit string) form output terminals (Y) to input signal selecting terminals (S) of the multiplexer circuit 82 and input signal selecting terminals (S) of a multiplexer circuit 83 used as a register column selecting switch through invertor circuits.

As described above, one of the register lines is selected using a register line selecting switch constructed by a combination of the priority encoder circuit 81, the multiplexer circuit 82 and the bias circuits 90a to 90g.

Figure 7A:
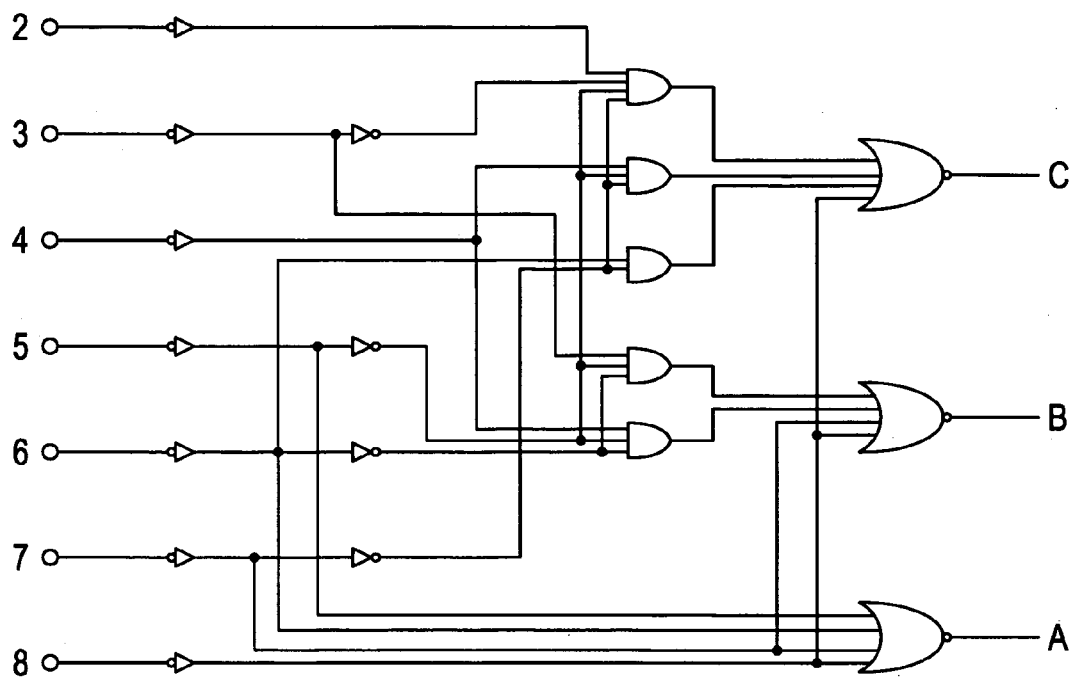
FIGS. 7A and 7B show a priority encoder circuit and a multiplexer circuit, respectively.
Figure 7B:
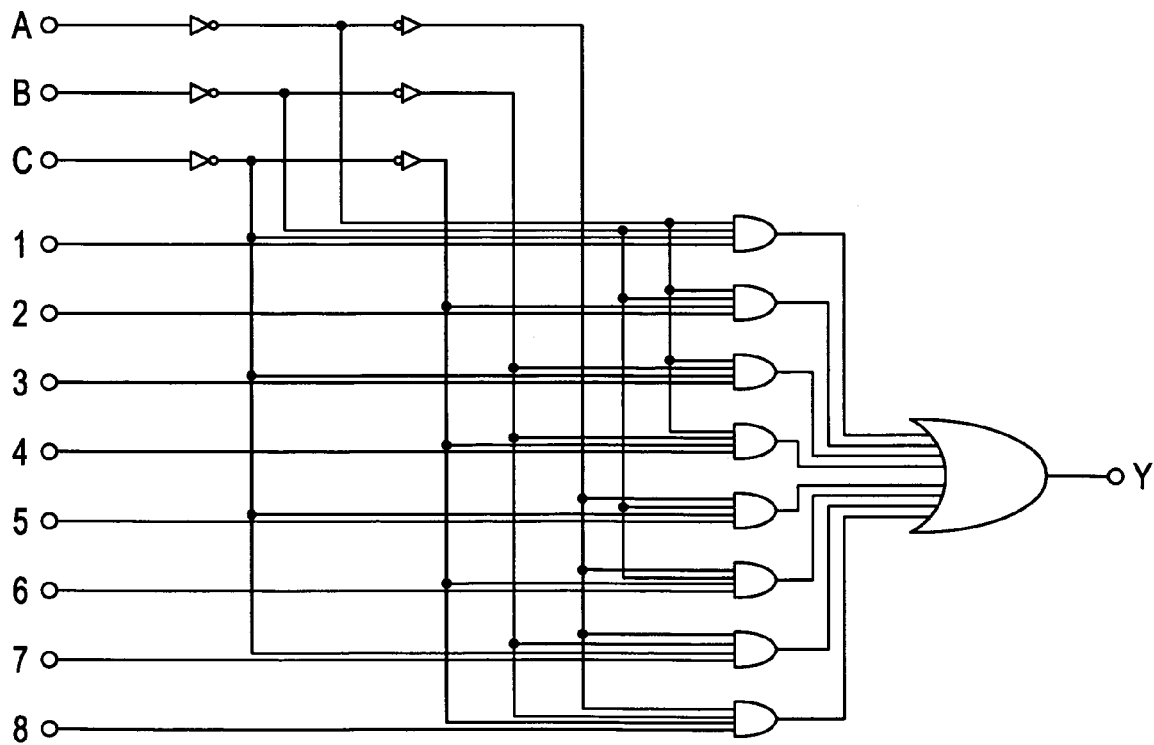

FIG. 7A shows an equivalent circuit of a 8 bit priority encoder circuit, and FIG. 7B shows an equivalent circuit of a 8 bit input multiplexer circuit. Also, FIG. 12 shows a truth table of the priority encoder circuit of FIG. 7A.

Figure 4:
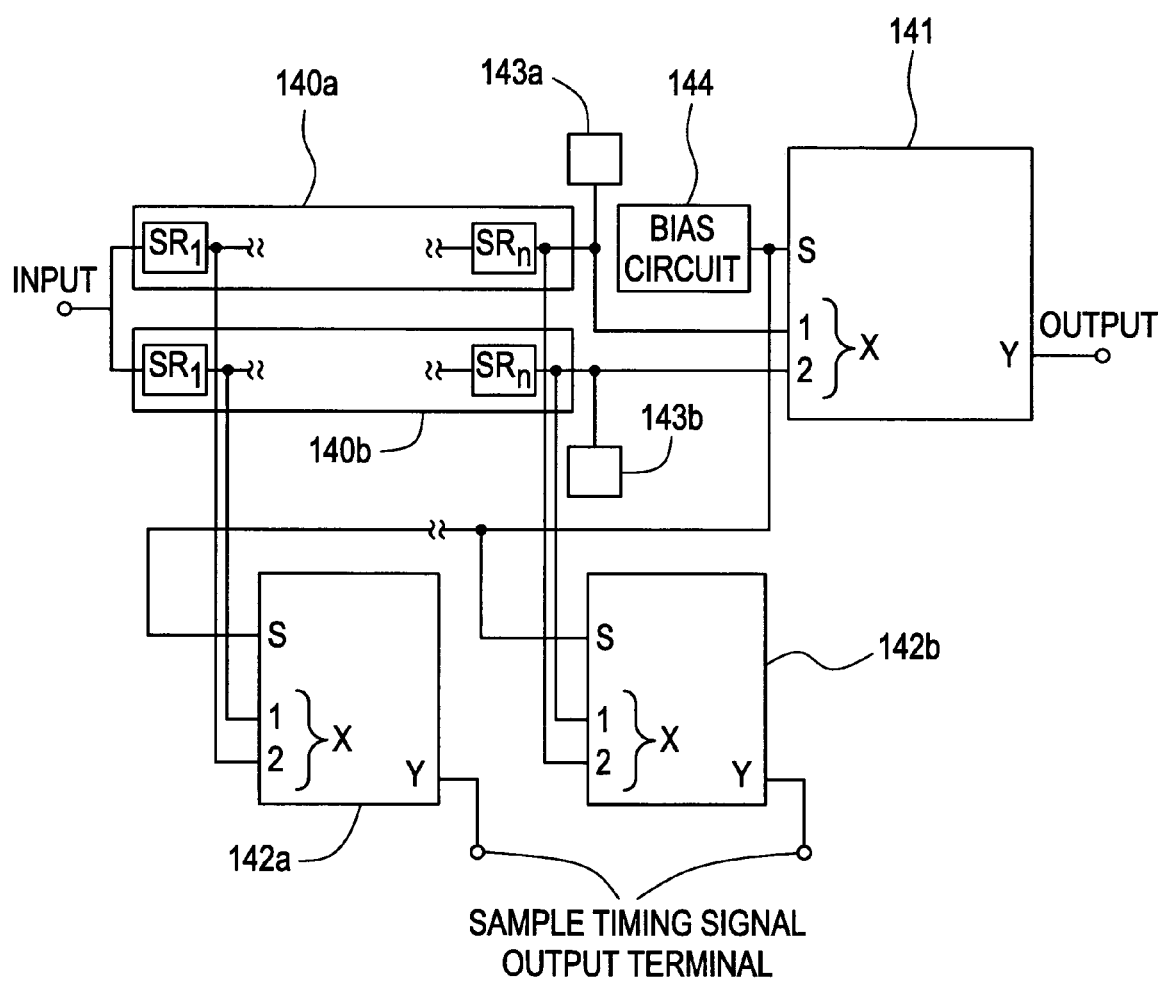
FIG. 4 shows a shift register selecting switch of the embodiment.
Figure 5:
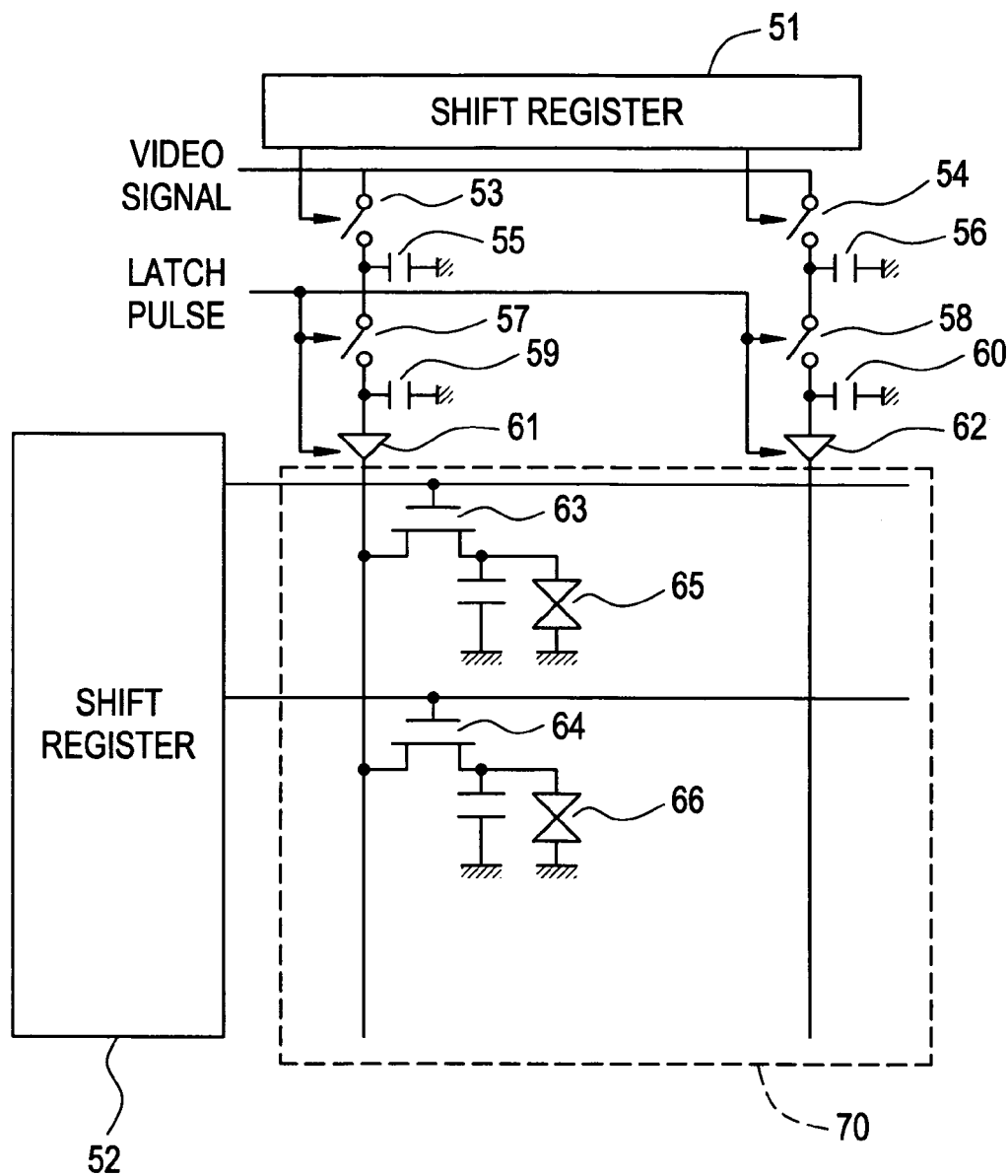
FIG. 5 shows a schematic view of a common active matrix type display device.
Figure 6A:
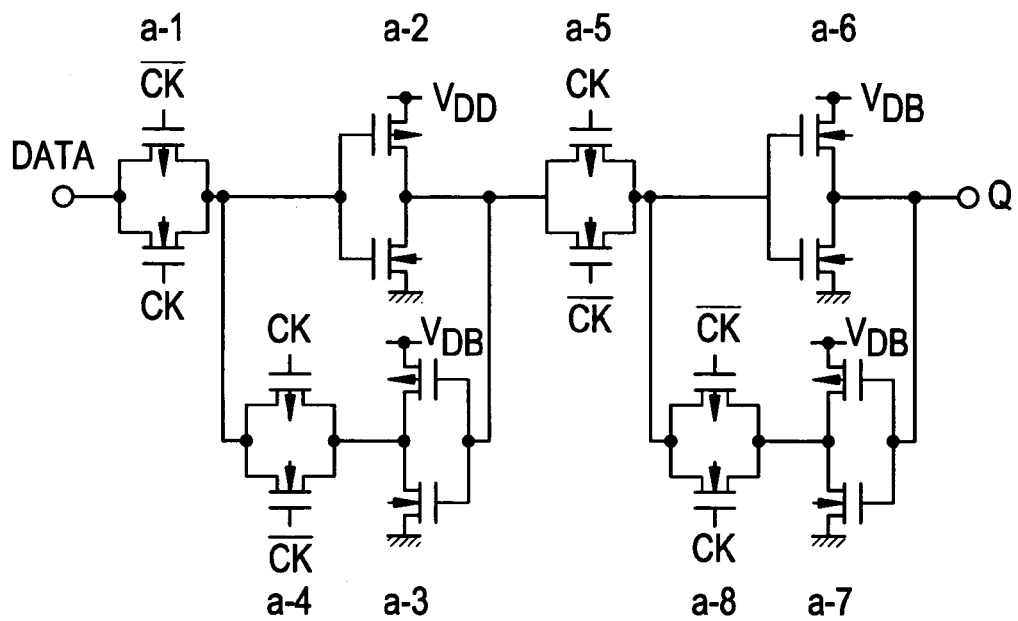
FIGS. 6A and 6B show a common register, respectively.
Figure 6B:
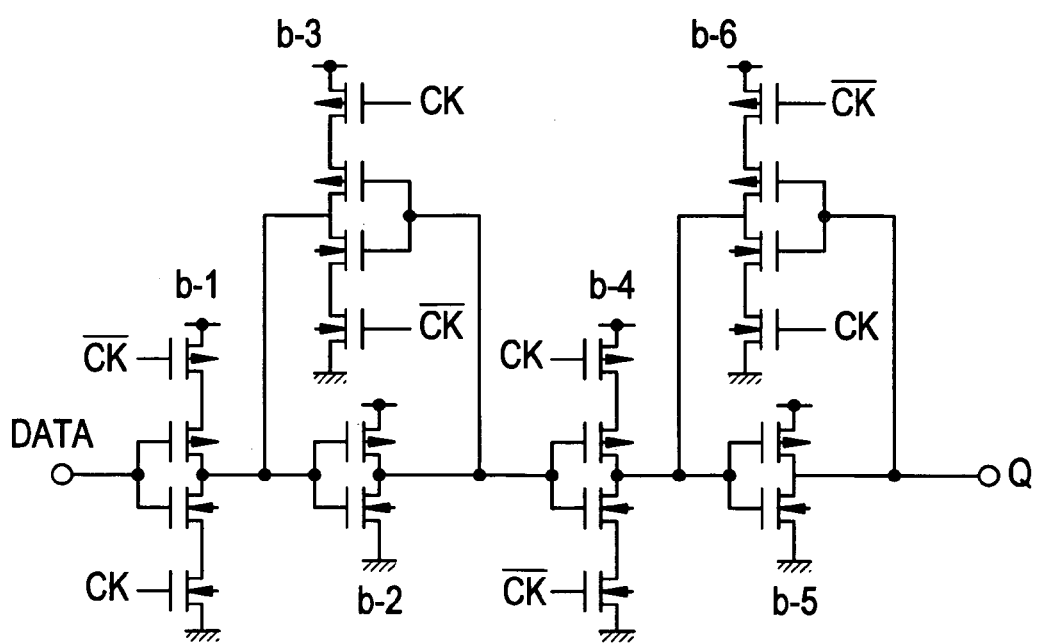

FIG. 4 shows a case wherein two register lines 140a and 140b are used in one register group. Since the number of register lines is 2, it is not necessary to use a priority encoder circuit as described above. Therefore, outputs of all register lines 140a and 140b are connected with input terminals (X) of a multiplexer circuit 141 for register line selection. An output terminal of a bias circuit 144 is connected with an input signal selecting terminal (S) of the multiplexer circuit 141. Defect detection terminals 143a and 143b are used to detect a register line having defect.

When one of register line is normal, a low level (L) bias is supplied to the bias circuit 144 corresponding to the one of the register lines. Therefore, since a level of the input signal selecting terminal (S) of the multiplexer circuit 141 is determined, the multiplexer circuit 141 selects a normal register line, to use an output of a last register of the selected register line as an output of a register group having the selected register line.

A structure of a register column selecting switch will be described below using FIG. 4.

Register column selecting switches includes multiplexer circuits 142a, . . . , and 142b, respectively. Outputs of the registers $SR_1$ ($SR_n$) constructing each column are connected with input terminals (X) of the multiplexer circuits 142a (142b) for register column selection. To select a register in a column, an output of the bias circuit 144 is connected with input signal selecting terminals (s) of the multiplexer circuits 142a and 142b.

As described above, a register column selecting switch is constructed by a combination of the bias circuit 144 and the multiplexer circuits 142a and 142b.

A structure of a bias circuit will be described using FIGS. 8A to 8C.

Figure 8A:
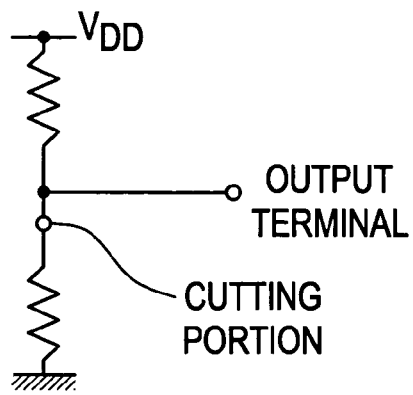
FIGS. 8A to 8C show a bias circuit, respectively.

In a bias circuit as shown in FIG. 8A, a pull-up resistor is connected with a pull-down resistor in serial, and an output terminal and a cutting portion are provided between these resistors. A resistance value ratio between the pull-up resistor and the pull-down resistor is 100:1, and may be set in a range which a voltage level detected on the output terminal becomes a low level (L).

A bias circuit corresponding to a normal register line holds a low level (L), and bias circuits corresponding to register lines other than the normal register line holds a high level (H) by cutting a cutting portion of the bias circuit using a laser to obtain a pull-up state. As a result, an input signal of the multiplexer circuit can be selected.

Figure 8B:
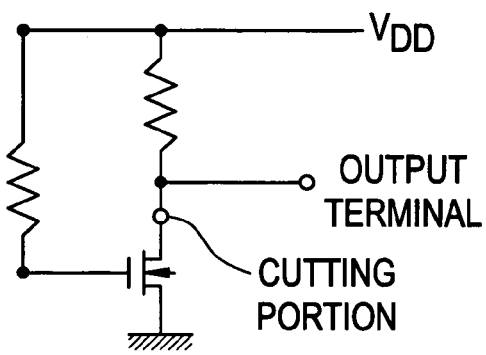

In a bias circuit as shown in FIG. 8B, an analog switch using an N-type TFT is used. As described above, a bias circuit corresponding to a normal register line holds a low level (L), and bias circuits corresponding to register lines other than the normal register line holds a high level (H) by cutting a cutting portion of the bias circuit using a laser to obtain a pull-up state. As a result, an input signal of the multiplexer circuit can be selected.

Figure 8C:
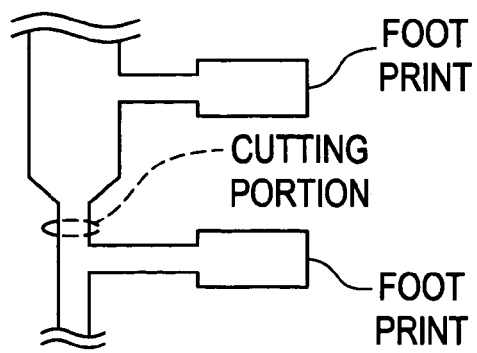

FIG. 8C shows cutting of a cutting portion of a bias circuit. The cutting portion may be cut by applying a high voltage to two foot prints.

Figure 11A:
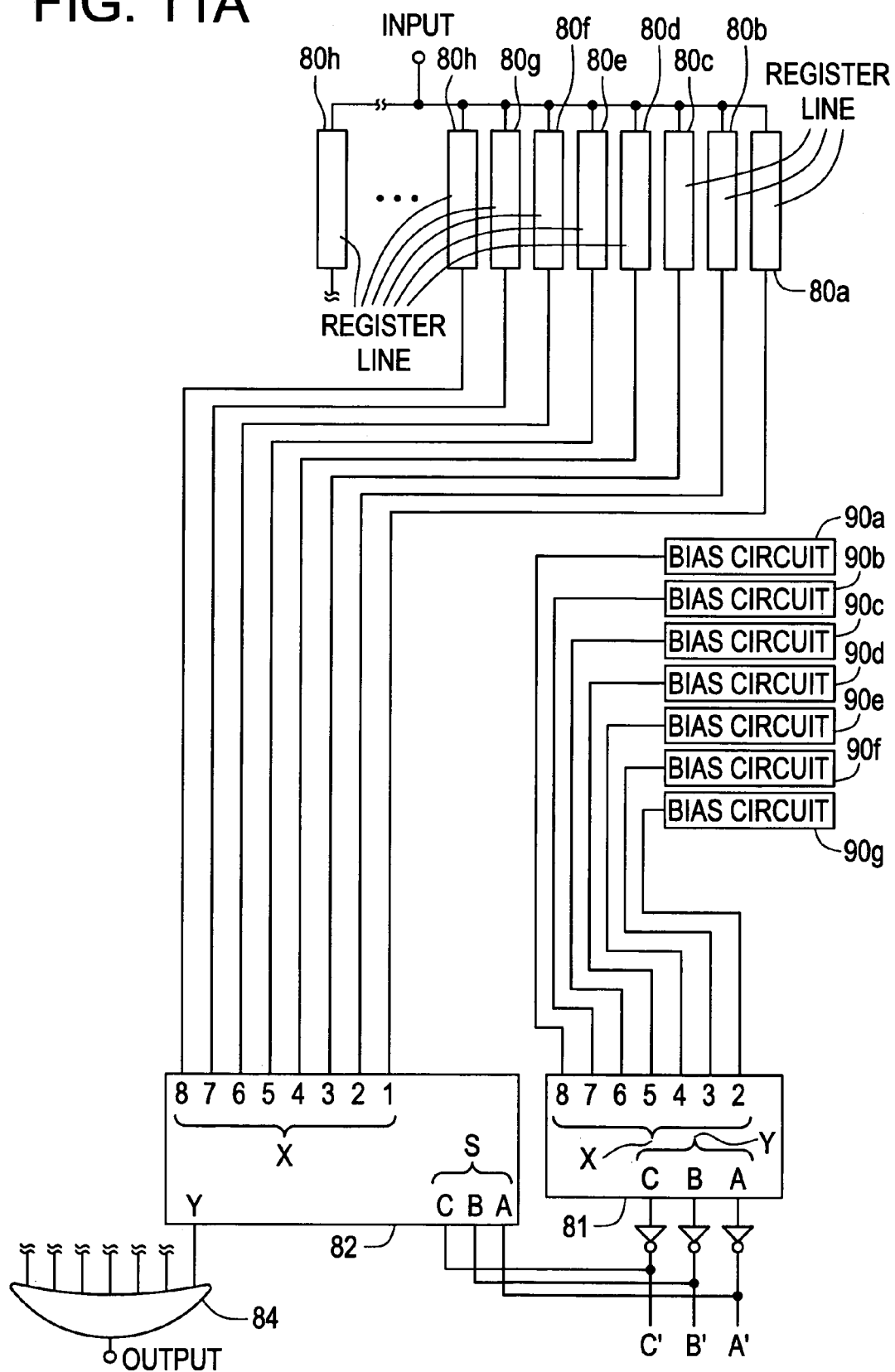
FIGS. 11A and 11B show a shift register selecting circuit of the embodiment.
Figures 11B, 12:
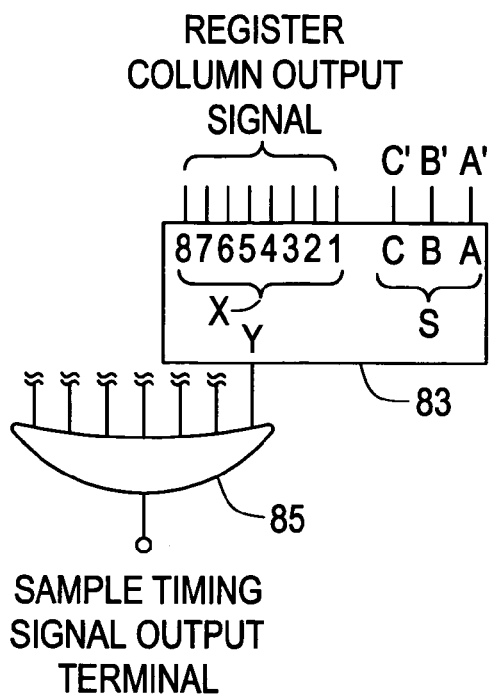
FIG. 12 shows a truth table of a priority encoder circuit.

As shown in FIGS. 11A and 11B, in a case wherein the number of register lines is n (n>2), outputs of last registers of all register lines 80a to 80n are connect with input terminals (X) of a multiplexer circuit 82 for register line selection. Also, bias circuits 90a to 90g each having output terminals are arranged in correspondence to the register lines, and the output terminals of the bias circuits 90a to 90g are connected with input terminals (X) of the priority encoder circuit 81. The output terminals of the priority encoder circuit 81 is connected with input signal selection terminals of the multiplexer circuit 82 through invertor circuits.

When a normal register line is detected, an output of a bias circuit corresponding to the register line is held to a low level (L). An output of a bias circuit corresponding to the register line is held to a low level (L). Also, an output of a bias circuit corresponding to the register line other than the normal register line is held to a high level (H). As described above, outputs of the priority encoder circuit 81 are determined by holding output levels of the output terminals of the bias circuits. Therefore, since levels of input signal selection terminals of the multiplexer circuit 82 are determined, the multiplexer circuit 82 selects a normal register line, so chat an output of a last register of the selected register line is input to an input terminal of an OR circuit 84. An output of the OR circuit 84 is used as an input of next register group in a case wherein a plurality of register groups are arranged in a shift register circuit.

A register column is defined at a column direction of registers of register lines. Multiplexer circuits for register column selection are arranged for each register column. The number of the multiplexer circuits for register column selection coincide with the number of registers of one register line.

When a normal register line is selected in one register group, an output of the priority encoder circuit 81 is input to input signal selection terminals (S) of a multiplexer circuit 83 for register column selection through invertor circuits. Therefore, registers included in the selected register line are selected in a column direction, so that sample timing signals can be output to source lines of an active matrix type display device.

Figure 13:
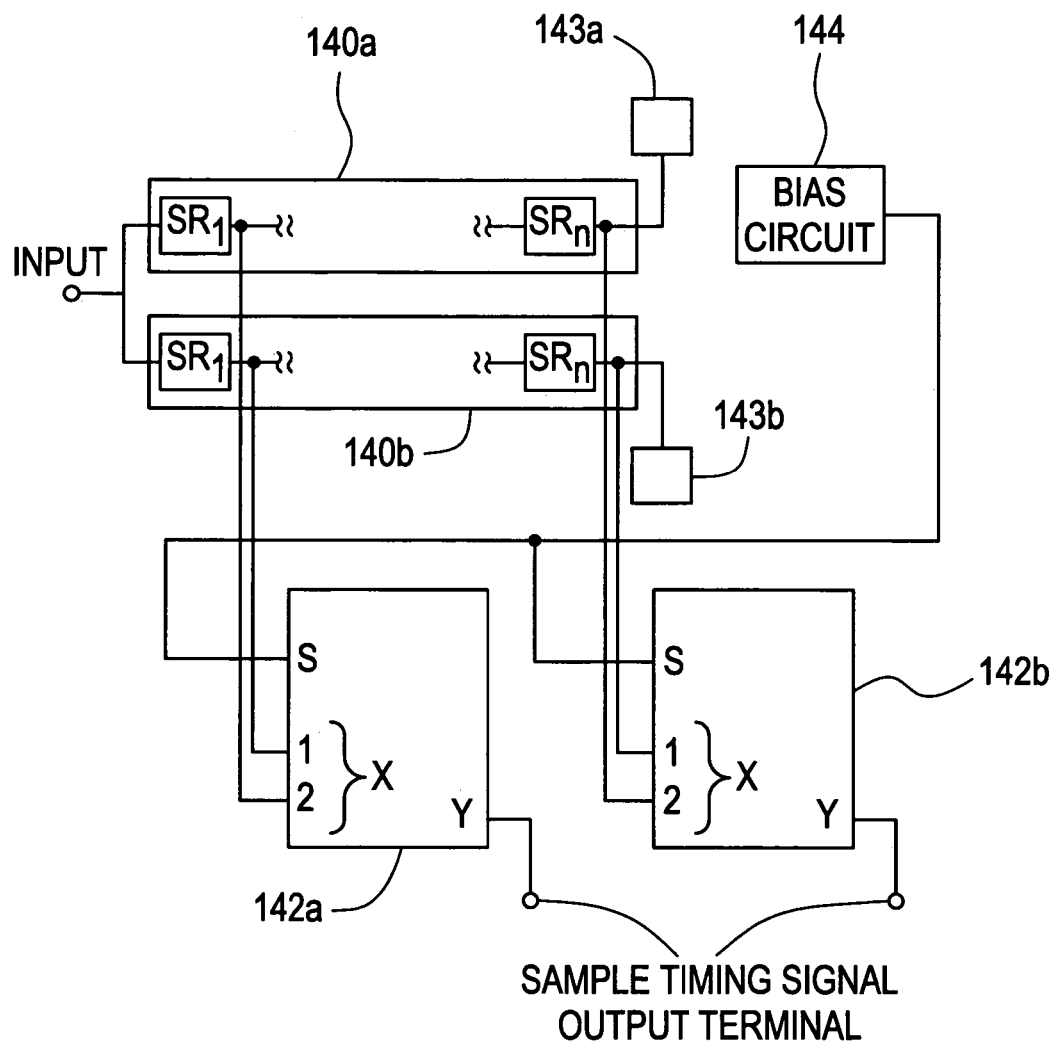
FIG. 13 shows a shift register selecting switch of another embodiment.

FIG. 13 shows a case wherein two register lines 140a and 140b are used in one register group and a shift register circuit has only one register group. As shown in FIG. 13, a multiplexer circuit for register line selection can be omitted in comparison with FIG. 4.

As described above, a normal register line is selected in each register group, and a shift register circuit is constructed by connecting with each register group each other.

Figure 9A:
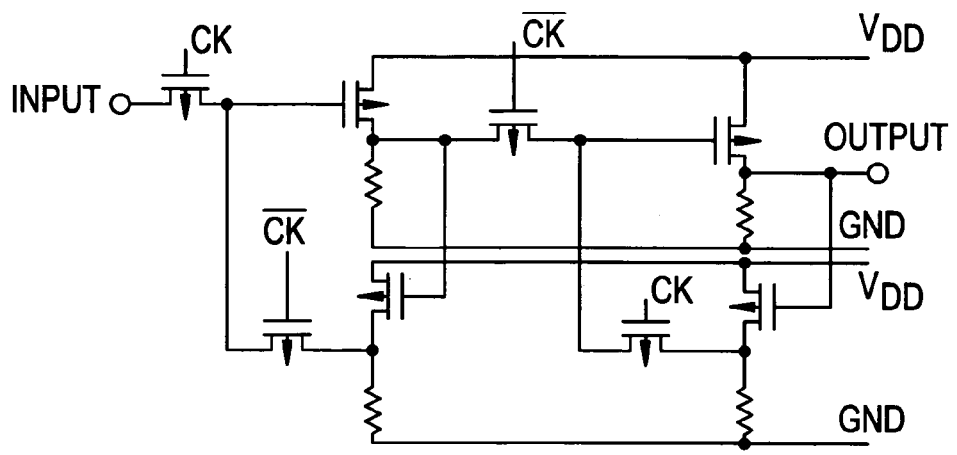
FIGS. 9A to 9C show a register constructed by p-channel transistors.
Figure 9B:
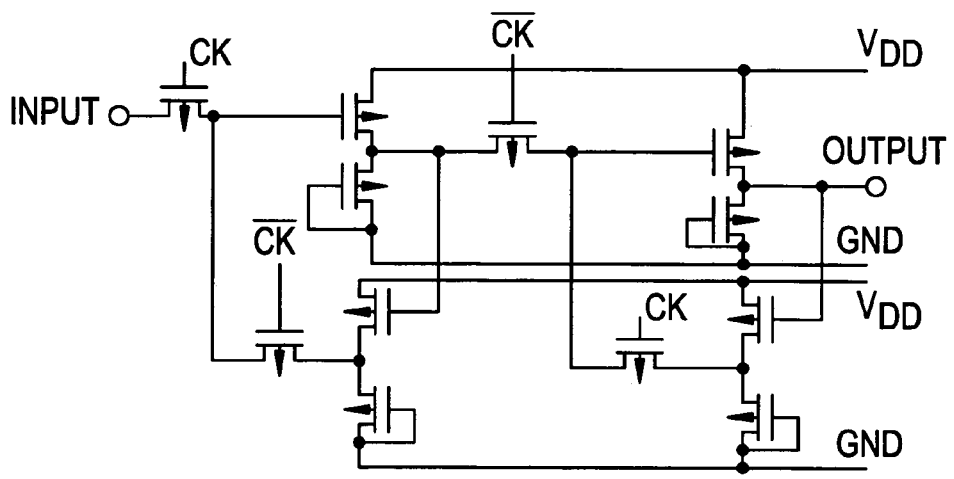
Figure 9C:
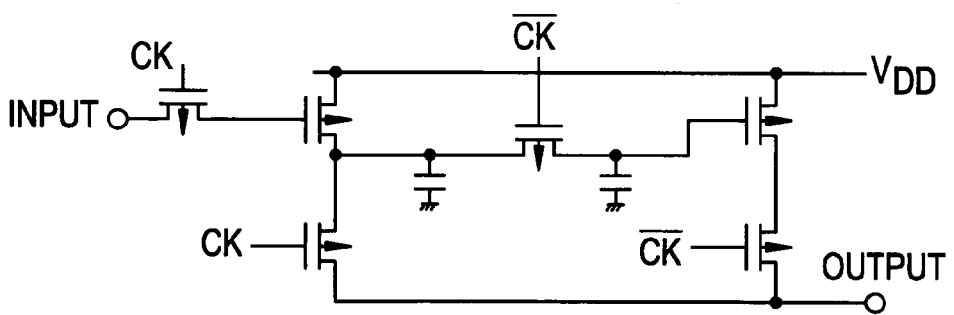

In the above embodiment, although a complementary type is used, a circuit using an N-channel type or a P-channel type may be constructed. In this state, since only one impurity doping process is performed, the number of forming processes can be decreased. FIGS. 9A to 9C show shift register circuit constructed by only P-channel type. FIG. 9A shows an invertor circuit constructed using P-channel transistors and resistors. FIG. 9B shows an invertor circuit constructed using P-channel transistors. FIG. 9C shows a dynamic type shift register. A multiplexer circuit, a priority encoder circuit and like can be constructed using P-channel transistors and resistors.

In the embodiment, although only P-channel type transistor is used, a N-channel type transistor can be used.

According to the present invention, a detective rate of one register is constant and redundancy shift register circuit is used, so that a yield of a whole shift register circuit can be increased and reliability of a shift register circuit can be improved.

What is claimed is:

1. An active matrix display device comprising:
a substrate having an insulating surface;
a plurality of pixel electrodes arranged in a matrix form over said substrate;
a plurality of switching elements operationally connected to said pixel electrodes, each of said switching elements comprising a first thin film transistor over said substrate;
a display medium comprising an emissive material and capable of electrically changing luminous strength disposed at each of said pixel electrodes; and
a driver circuit comprising a plurality of second thin film transistors over said substrate for driving said plurality of switching elements,
wherein each of said plurality of second thin film transistors comprises a crystallized semiconductor layer, a gate insulating film adjacent to said crystallized semiconductor layer and a gate electrode adjacent to said gate insulating film,
wherein channel forming regions of said first thin film transistor and said plurality of second thin film transistors have a same conductivity type,
wherein said crystallized semiconductor layer has source and drain regions and at least one lightly doped region, and
wherein said lightly doped region is formed by an ion doping method, using said gate electrode as a mask.

2. The active matrix display device according to claim 1 wherein said gate electrode is located over said semiconductor layer.

3. The active matrix display device according to claim 1 wherein all of said plurality of second thin film transistors are p-channel transistors.

4. The active matrix display device according to claim 1 wherein all of said plurality of second thin film transistors are n-channel transistors.

5. The active matrix display device according to claim 1 wherein said substrate is a glass substrate.

6. The active matrix display device according to claim 1 wherein said crystallized semiconductor layer comprises silicon.

7. An active matrix display device comprising:
a substrate having an insulating surface;
a plurality of pixel electrodes arranged in a matrix form over said substrate;
a plurality of switching elements operationally connected to said pixel electrodes, each of said switching elements comprising a first thin film transistor over said substrate;
a display medium comprising an emissive material and capable of electrically changing luminous strength disposed at each of said pixel electrodes; and
a driver circuit comprising a plurality of second thin film transistors over said substrate for driving said plurality of switching elements,
wherein each of said plurality of second thin film transistors comprises a crystallized semiconductor layer, a gate insulating film adjacent to said crystallized semiconductor layer and a gate electrode adjacent to said gate insulating film,
wherein said crystallized semiconductor layer has source and drain regions and at least one lightly doped region, and
wherein said lightly doped region is formed by an ion doping method using said gate electrode as a mask.

8. The active matrix display device according to claim 7 wherein said substrate is a glass substrate.

9. The active matrix display device according to claim 7 wherein said source and drain regions and said at least one lightly doped region are doped with phosphorus.

10. The active matrix display device according to claim 7 wherein said gate electrode is located over said semiconductor layer.

11. The active matrix display device according to claim 7 wherein said gate electrode is located over said semiconductor layer.

12. An active matrix display device comprising:
a substrate having an insulating surface;
a plurality of pixel electrodes arranged in a matrix form over said substrate;
a plurality of switching elements operationally connected to said pixel electrodes, each of said switching elements comprising a first thin film transistor over said substrate;
a display medium comprising an emissive material and capable of electrically changing luminous strength disposed at each of said pixel electrodes; and
a gate driver circuit comprising a plurality of second thin film transistors over said substrate for driving said plurality of switching elements,
wherein each of said plurality of second thin film transistors comprises a crystallized semiconductor layer, a gate insulating film adjacent to said crystallized semiconductor layer and a gate electrode adjacent to said gate insulating film,
wherein channel forming regions of said first thin film transistor and said plurality of second thin film transistors have a same conductivity type,
wherein said crystallized semiconductor layer has source and drain regions and at least one lightly doped region, and
wherein said lightly doped region is formed by an ion doping method, using said gate electrode as a mask.

13. The active matrix display device according to claim 12 wherein said substrate is a glass substrate.

14. The active matrix display device according to claim 12 wherein said gate electrode is located over said semiconductor layer.

15. The active matrix display device according to claim 12 wherein said crystallized semiconductor layer comprises silicon.

16. An active matrix display device comprising:
a substrate having an insulating surface;
a plurality of pixel electrodes arranged in a matrix form over said substrate;
a plurality of switching elements operationally connected to said pixel electrodes, each of said switching elements comprising a first thin film transistor over said substrate;
a display medium comprising an emissive material and capable of electrically changing luminous strength disposed at each of said pixel electrodes; and
a CMOS circuit comprising at least one n-channel thin film transistor and one p-channel thin film transistor, over said substrate,
wherein each of said n-channel and p-channel thin film transistors comprising a crystallized semiconductor layer, a gate insulating film adjacent to said crystallized semiconductor layer and a gate electrode adjacent to said gate insulating film,
wherein said crystallized semiconductor layer has source and drain regions and at least one lightly doped region, and
wherein said lightly doped region is formed by an ion doping method using said gate electrode as a mask.

17. The active matrix display device according to claim 16 wherein said substrate is a glass substrate.

18. The active matrix display device according to claim 16 wherein said crystallized semiconductor layer comprises silicon.

19. An active matrix display device comprising:
a substrate having an insulating surface;
a plurality of pixel electrodes arranged in a matrix form over said substrate;
a plurality of switching elements operationally connected to said pixel electrodes, each of said switching elements comprising a first thin film transistor over said substrate;
a display medium comprising an emissive material and capable of electrically changing luminous strength disposed at each of said pixel electrodes; and
a driver circuit comprising a plurality of second thin film transistors over the substrate for driving said plurality of switching elements,
wherein each of said first thin film transistor and said plurality of second thin film transistors comprises a crystallized semiconductor layer, a gate insulating film adjacent to said crystallized semiconductor layer and a gate electrode adjacent to said gate insulating film,
wherein channel forming regions of said first thin film transistor and said plurality of second thin film transistors have a same conductivity type,
wherein said crystallized semiconductor layer has source and drain regions and at least one lightly doped region, and
wherein said lightly doped region is formed by an ion doping method, using said gate electrode as a mask.

20. The active matrix display device according to claim 19 wherein said gate electrode is located over said semiconductor layer.

21. The active matrix display device according to claim 19 wherein all of said plurality of second thin film transistors are p-channel transistors.

22. The active matrix display device according to claim 19 wherein all of said plurality of second thin film transistors are n-channel transistors.

23. The active matrix display device according to claim 19 wherein said substrate is a glass substrate.

24. The active matrix display device according to claim 19 wherein said crystallized semiconductor layer comprises silicon.

25. An active matrix display device comprising:
a substrate having an insulating surface;
a plurality of pixel electrodes arranged in a matrix form over said substrate;
a plurality of switching elements operationally connected to said pixel electrodes, each of said switching elements comprising a first thin film transistor over said substrate;
a display medium comprising an emissive material and capable of electrically changing luminous strength disposed at each of said pixel electrodes; and
a driver circuit comprising a plurality of second thin film transistors over said substrate for driving said plurality of switching elements,
wherein each of said first thin film transistor and said plurality of second thin film transistors comprises a crystallized semiconductor layer, a gate insulating film adjacent to said crystallized semiconductor layer and a gate electrode adjacent to said gate insulating film,
wherein said crystallized semiconductor layer has source and drain regions and at least one lightly doped region, and wherein said lightly doped region is formed by an ion doping method, using said gate electrode as a mask.

26. The active matrix display device according to claim 25 wherein said substrate is a glass substrate.

27. The active matrix display device according to claim 25 wherein said source and drain regions and said at least one lightly doped region are doped with phosphorus.

28. The active matrix display device according to claim 25 wherein said gate electrode is located over said semiconductor layer.

29. The active matrix display device according to claim 25 wherein said crystallized semiconductor layer comprises silicon.

30. An active matrix display device comprising:
a substrate having an insulating surface;
a plurality of pixel electrodes arranged in a matrix form over said substrate;
a plurality of switching elements operationally connected to said pixel electrodes, each of said switching elements comprising a first thin film transistor over said substrate;
a display medium comprising an emissive material and capable of electrically changing luminous strength disposed at each of said pixel electrodes; and
a gate driver circuit comprising a plurality of second thin film transistors over said substrate for driving said plurality of switching elements,
wherein each of said first thin film transistor and said plurality of second thin film transistors comprises a crystallized semiconductor layer, a gate insulating film adjacent to said crystallized semiconductor layer and a gate electrode adjacent to said gate insulating film,
wherein channel forming regions of said first thin film transistor and said plurality of second thin film transistors have a same conductivity type,
wherein said crystallized semiconductor layer has source and drain regions and at least one lightly doped region, and
wherein said lightly doped region is formed by an ion doping method, using said gate electrode as a mask.

31. The active matrix display device according to claim 30 wherein said substrate is a glass substrate.

32. The active matrix display device according to claim 30 wherein said gate electrode is located over said semiconductor layer.

33. The active matrix display device according to claim 30 wherein said crystallized semiconductor layer comprises silicon.

34. An active matrix display device comprising:
a substrate having an insulating surface;
a plurality of pixel electrodes arranged in a matrix form over said substrate;
a plurality of switching elements operationally connected to said pixel electrodes, each of said switching elements comprising a first thin film transistor over said substrate;
a display medium comprising an emissive material and capable of electrically changing luminous strength disposed at each of said pixel electrodes; and
a CMOS circuit comprising at least one n-channel thin film transistor and one p-channel thin film transistor, over said substrate,
wherein each of said first thin film transistor and said n-channel and p-channel thin film transistors comprises a crystallized semiconductor layer, a gate insulating film adjacent to said crystallized semiconductor layer and a gate electrode adjacent to said gate insulating film,
wherein said crystallized semiconductor layer has source and drain regions and at least one lightly doped region, and
wherein said lightly doped region is formed by an ion doping method, using said gate electrode as a mask.

35. The active matrix display device according to claim 34 wherein said substrate is a glass substrate.

36. The active matrix display device according to claim 34 wherein said crystallized semiconductor layer comprises silicon.

* * * * *